(12) United States Patent
Gaska et al.

(10) Patent No.: US 7,554,123 B2
(45) Date of Patent: Jun. 30, 2009

(54) OHMIC CONTACT FOR NITRIDE-BASED SEMICONDUCTOR DEVICE

(75) Inventors: Remigijus Gaska, Columbia, SC (US); Jianping Zhang, Lexington, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 310 days.

(21) Appl. No.: 11/208,679

(22) Filed: Aug. 22, 2005

(65) Prior Publication Data

US 2006/0046458 A1 Mar. 2, 2006

Related U.S. Application Data

(60) Provisional application No. 60/604,218, filed on Aug. 25, 2004.

(51) Int. Cl.
*H01L 29/26* (2006.01)
*H01L 33/00* (2006.01)

(52) U.S. Cl. .............. 257/79; 257/103; 257/E29.144; 257/E33.028; 257/E33.063

(58) Field of Classification Search ............. 438/576; 257/79, 103, E29.144, E33.028, E33.063
See application file for complete search history.

(56) References Cited

U.S. PATENT DOCUMENTS

| 5,225,039 A * | 7/1993 | Ohguri ............... 216/24 |
| 6,717,185 B2 * | 4/2004 | Edmond et al. ........ 257/97 |
| 2002/0008243 A1 * | 1/2002 | Goetz et al. .......... 257/79 |
| 2004/0026698 A1 * | 2/2004 | Lee et al. ............ 257/77 |
| 2004/0201038 A1 * | 10/2004 | Kimura et al. ........ 257/192 |

OTHER PUBLICATIONS

Saxler, A. et al., "Aluminum gallium nitride short-period superlattices doped with magnesium," Applied Physics Letters, vol. 74, No. 14, Apr. 5, 1999, pp. 2023-2025.

Peng, H. et al., "Ultraviolet light-emitting diodes operating in the 340 nm wavelength range and application to time-resolved fluorescence spectroscopy," Applied Physics Letters, vol. 85, No. 8, Aug. 2004, pp. 1436-1438.

Kozodoy, Peter et al., "Enhanced Mg doping efficiency in Al0.2Ga0.8N/GaN superlattices," Applied Physics Letters, vol. 74, No. 24, Jun. 14, 1999, pp. 3681-3683.

Goepfert, I.D. et al., "Experimental and theoretical study of acceptor activation and transport properties in p-type AlxGa1-xN/GaN superlattices," Journal of Applied Physics, vol. 88, No. 4, Aug. 15, 2000, pp. 2030-2038.

Wang, T. et al., "1 mW AlInGaN-based ultraviolet light-emitting diode with an emission wavelength of 348 nm grown on sapphire substrate," Applied Physics Letters, vol. 81, No. 14, Sep. 30, 2002, pp. 2508-2510.

(Continued)

*Primary Examiner*—Asok K Sarkar
(74) *Attorney, Agent, or Firm*—Hoffman Warnick LLC

(57) ABSTRACT

An improved ohmic contact for a nitride-based semiconductor device is provided. In particular, a semiconductor device and method of manufacturing the semiconductor device are provided in which a semiconductor structure has an ohmic contact that includes a contact layer and a metal layer thereon. The contact layer includes at least Aluminum (Al) and Indium (In), and can further include Gallium (Ga) and/or Nitrogen (N). The molar fraction of Al and/or In can be increased/decreased within the contact layer.

18 Claims, 5 Drawing Sheets

OTHER PUBLICATIONS

Nishida, Toshio et al., "Efficient and high-power AlGaN-based ultraviolet light-emitting diode grown on bulk GaN," Applied Physics Letters, vol. 79, No. 6, Aug. 6, 2001, pp. 711-712.

Kozodoy, Peter et al., "Polarization-enhanced Mg doping of AlGaN/GaN superlattices," Applied Physics Letters, vol. 75, No. 16, Oct. 18, 1999, pp. 2444-2446.

Shur, M.S. et al., "Accumulation hole layer in p-GaN/AlGaN heterostructures," Applied Physics Letters, vol. 76, No. 21, May 22, 2000, pp. 3061-3063.

Zhang, J.P. et al., "Milliwatt power deep ultraviolet light-emitting diodes over sapphire with emission at 278 nm," Applied Physics Letters, vol. 81, No. 26, Dec. 23, 2002, pp. 4910-4912.

Zhang, Jianping et al., "AlGaN multiple-quantum-well-based, deep ultraviolet light-emitting diodes with significantly reduced long-wire emission," Applied Physics Letters, vol. 83, No. 17, Oct. 27, 2003, pp. 3456-3458.

Sun, W.H. et al., "AlGaN-based 280 nm light-emitting diodes with continuous wave powers in excess of 1.5 mW," Applied Physics Letters, vol. 85, No. 4, Jul. 26, 2004, pp. 531-533.

Adivarahan, V. et al., "High-efficiency 269 nm emission deep ultraviolet light-emitting diodes," Applied Physics Letters, vol. 84, No. 23, Jun. 7, 2004, pp. 4762-4764.

Yasan, A. et al., "4.5 mW operation of AlGaN-based 267 nm deep-ultraviolet light-emitting diodes," Applied Physics Letters, vol. 83, No. 23, Dec. 8, 2003, pp. 4701-4703.

Fischer, A.J. et al., "Room-temperature direct current operation of 290 nm light-emitting diodes with milliwatt power levels," Applied Physics Letters, vol. 84, No. 17, Apr. 26, 2004, pp. 3394-3396.

Adivarahan, V. et al., "Very-low-specific-resistance Pd/Ag/Au/Ti/Au alloyed ohmic contact to p GaN for high-current devices," Applied Physics Letters, vol. 78, No. 18, Apr. 30, 2001, pp. 2781-2783.

* cited by examiner

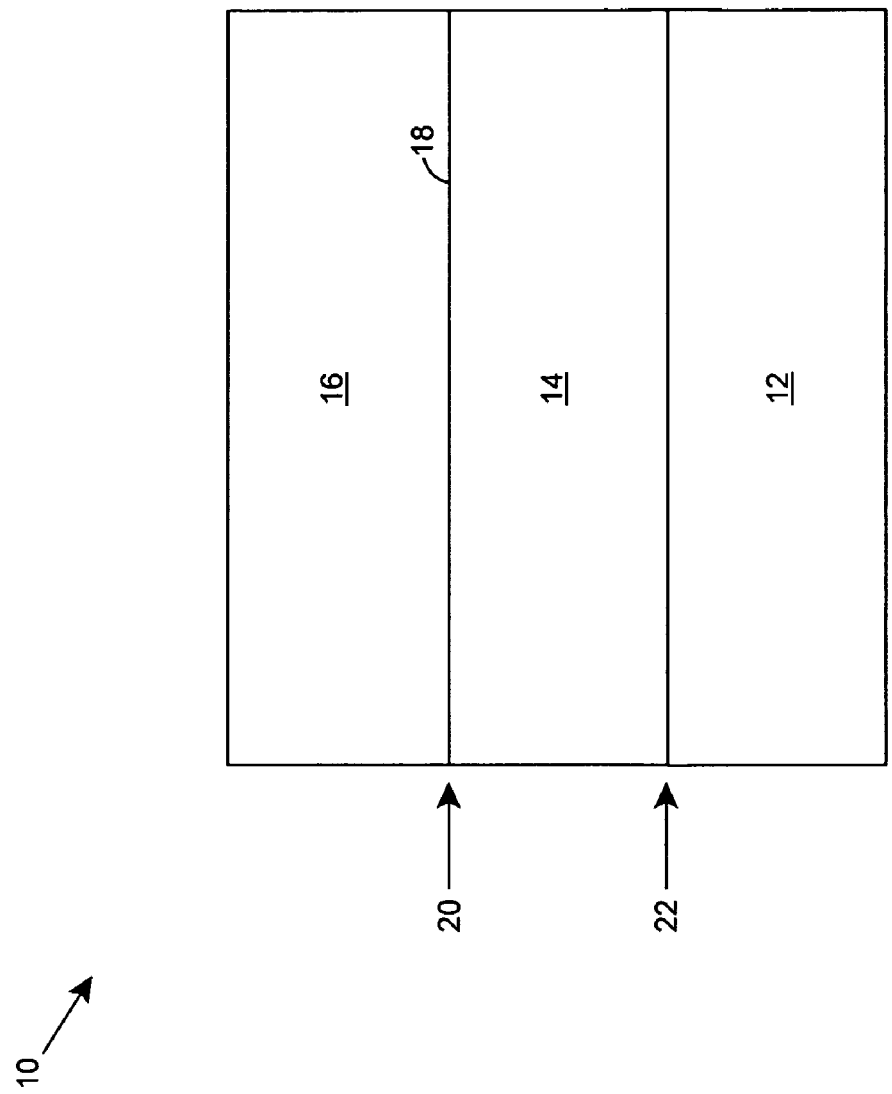

OHMIC CONTACT FOR NITRIDE-BASED SEMICONDUCTOR DEVICE

REFERENCE TO PRIOR APPLICATION

The current application claims the benefit of co-pending U.S. Provisional Application No. 60/604,218, entitled "Ohmic Contact to p-Type Nitride Semiconductor", which was filed on Aug. 25, 2004, and which is hereby incorporated herein by reference.

BACKGROUND OF THE INVENTION

1. Technical Field

The invention relates generally to ohmic contacts, and more specifically, to an improved ohmic contact for a nitride-based semiconductor device.

2. Background Art

A challenge in developing high power III-V nitride-based semiconductor devices, such as light emitting diodes, laser diodes, bipolar junction transistors, and heterojunction bipolar transistors, is the development of an ohmic contact that has both a low specific resistance and a high current carrying capability. Magnesium (Mg), with a room-temperature activation energy as high as two hundred fifty meV, is a commonly used acceptor for p-type Gallium Nitride (GaN) semiconductors. To this extent, some approaches seek to develop an ohmic contact for a Mg-doped p-type GaN semiconductor. However, a relatively low p-doping (e.g., less than $1 \times 10^{18}$ cm$^{-3}$) in p-type GaN, which is achievable either by metalorganic chemical vapor deposition or molecular beam epitaxy, makes the formation of such p-type ohmic contacts difficult.

The activation energy for Mg increases almost linearly as Aluminum (Al) is added to form Mg-doped AlGaN ternary semiconductors, which are used in semiconductor devices such as deep ultraviolet light emitting diodes (UV LEDs). Consequently, several approaches have been suggested to enhance the Mg-doped AlGaN p-type conductivity. In one approach, a Mg-doped AlGaN/GaN short period superlattice (SPSL) replaces the p-type AlGaN semiconductor in the semiconductor device, such as a 340-350 nm UV LED. In this approach, the period of the SPSL is typically below four nanometers. Since minibands are formed in the SPSL, vertical conduction of the p-type SPSL should not be degraded.

In another approach, a Mg-doped AlGaN/GaN large period superlattice (LPSL) is used. In this approach, the period is typically larger than fifteen nanometers and the valence band discontinuity as well as the polarization fields can enhance the ionization of the acceptors in the AlGaN barriers and transfer holes into GaN wells. However, the large period inhibits wavefunction coupling between neighboring wells, which reduces the vertical conductivity. As a result, the LPSL approach can only achieve good horizontal p-type conductivity.

In still another approach, a p-type GaN/p-type AlGaN single heterostructure is used to achieve hole accumulation at the interface. The mechanism of this approach is similar to the LPSL approach. However, since only a single barrier exists for hole transportation, the vertical conductivity is greatly enhanced due to a high-density hole accumulation at the interface, field assisted tunneling, as well as thermal emission. Many deep UV LEDs use this approach for hole injection layers and obtain reasonably good power.

Using the last approach, p-type contact resistivity of $1.1 \times 10^{-6}$ ohm-cm$^2$ has been achieved. In particular, a Palladium/Silver/Gold/Titanium/Gold (Pd/Ag/Au/Ti/Au) metallic contact was used under high-current operation for a vertically conducting GaN/InGaN multiple quantum well LED structure grown on a Silicon Carbide (SiC) substrate. However, ohmic contacts to p-type nitrides remain a problem. Particularly for AlGaN compounds with a high Al molar fraction.

As a result, a need exists for an improved ohmic contact. In particular, a need exists an improved ohmic contact for a nitride-based semiconductor device that addresses one or more of these limitations and/or other limitation(s) not expressly discussed herein.

SUMMARY OF THE INVENTION

The invention provides an improved ohmic contact for a nitride-based semiconductor device. In particular, a semiconductor device and method of manufacturing the semiconductor device are provided in which a semiconductor structure has an ohmic contact that includes a contact layer and a metal layer thereon. The contact layer includes at least Aluminum (Al) and Indium (In), and can further include Gallium (Ga) and/or Nitrogen (N). The molar fraction of Al and/or In can be increased/decreased within the contact layer. Additionally, one or more aspects of the surface of the contact layer can be altered prior to depositing the metal layer thereon.

A first aspect of the invention provides a method of manufacturing a semiconductor device, the method comprising: obtaining a nitride-based semiconductor structure; growing a contact layer comprising at least Aluminum (Al) and Indium (In) on the semiconductor structure; and depositing a metal layer on the contact layer.

A second aspect of the invention provides a method of manufacturing a semiconductor device, the method comprising: obtaining a nitride-based semiconductor structure; growing a contact layer comprising Aluminum (Al), Indium (In), Gallium (Ga), and Nitrogen (N) on the semiconductor structure, wherein the growing step includes increasing or decreasing a molar fraction of one of Al or In from a metal layer-contact layer interface toward a contact layer-semiconductor structure interface; and depositing a metal layer on the contact layer.

A third aspect of the invention provides a nitride-based semiconductor device comprising: a nitride-based semiconductor structure; a contact layer comprising at least Aluminum (Al) and Indium (In) on the semiconductor structure; and a metal layer on the contact layer.

A fourth aspect of the invention provides a nitride-based semiconductor device comprising: a nitride-based semiconductor structure; a contact layer comprising Aluminum (Al), Indium (In), Gallium (Ga), and Nitrogen (N) on the semiconductor structure; and a metal layer on the contact layer, wherein a molar fraction of one of Al or In in the contact layer increases or decreases from a metal layer-contact layer interface toward a contact layer-semiconductor structure interface.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which:

FIG. 1 shows an illustrative ohmic contact for a nitride-based semiconductor device according to an embodiment of the invention

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 2A:
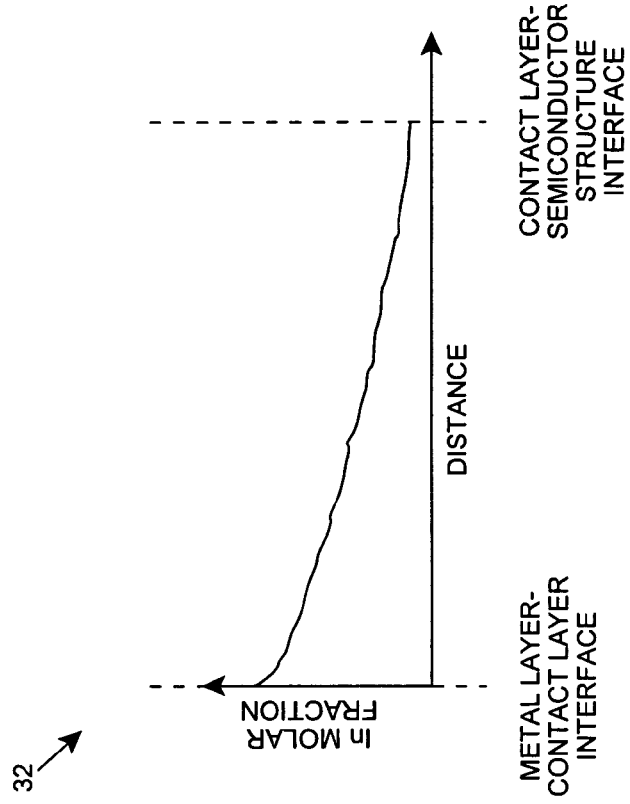
FIGS. 2A and 2B show illustrative composition profiles for Al and In, respectively, according to an embodiment of the invention.

As indicated above, the invention provides an improved ohmic contact for a nitride-based semiconductor device. In particular, a semiconductor device and method of manufacturing the semiconductor device are provided in which a semiconductor structure has an ohmic contact that includes a contact layer and a metal layer thereon. The contact layer includes at least Aluminum (Al) and Indium (In), and can further include Gallium (Ga) and/or Nitrogen (N). The molar fraction of Al and/or In can be increased/decreased within the contact layer. Additionally, one or more aspects of the surface of the contact layer can be altered prior to depositing the metal layer thereon.

Turning to the drawings, FIG. 1 shows an illustrative ohmic contact for a nitride-based semiconductor device 10 according to an embodiment of the invention. Device 10 includes a nitride-based semiconductor structure 12, a contact layer 14 on semiconductor structure 12, and a metal layer 16 on contact layer 14. Semiconductor structure 12 can comprise a substrate, any combination of one or more layers/structures (e.g., active, dielectric, etc.), zero or more contacts, etc., that are configured to provide the performance properties of device 10. In one embodiment, semiconductor structure 12 comprises a p-n junction on which contact layer 14 is grown. In any event, device 10 can be configured to operate as any type of nitride-based semiconductor device including, for example, a light emitting diode, a laser, a bipolar junction transistor, a heterojunction bipolar transistor, a thyristor, a photodiode, and the like.

The ohmic contact for device 10 comprises contact layer 14 and metal layer 16. Metal layer 16 can comprise any composition as is known in the art. For example, metal layer 16 can comprise Nickel (Ni) and/or Gold (Au). Contact layer 14 comprises at least Aluminum (Al) and Indium (In). In one embodiment, contact layer 14 comprises a p-type semiconductor and substantially consists of Al, In, Gallium (Ga) and Nitrogen (N). As shown, contact layer 14 is bounded by a metal layer-contact layer interface 20 and a contact layer-semiconductor structure interface 22. Contact layer 14 can be grown using any solution now known or later developed to have a thickness (e.g., distance between interfaces 20, 22) between approximately one nanometer and approximately five thousand nanometers.

Figure 2B:
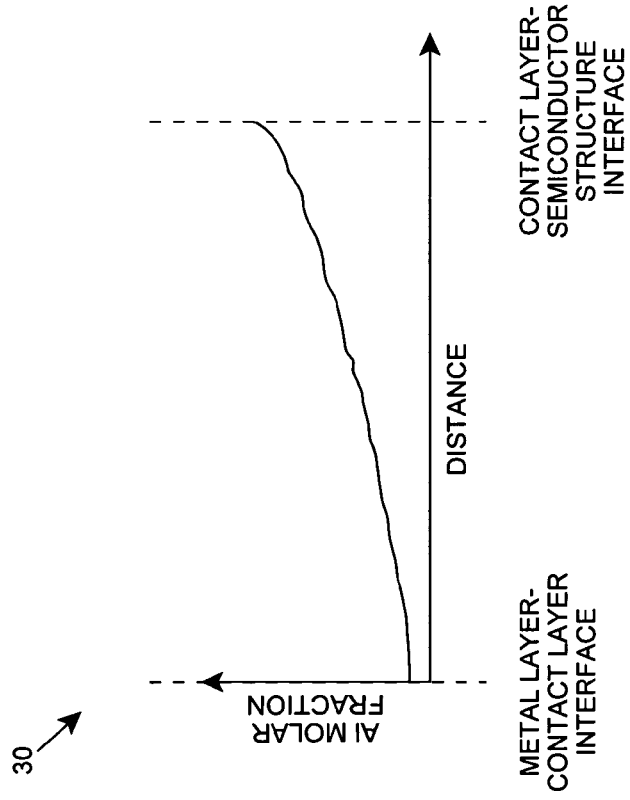

In one embodiment, the composition of contact layer 14 varies. By varying the composition of contact layer 14, a work function mismatch between contact layer 14 and metal layer 16 can be optimized, thereby improving the quality of the ohmic contact. For example, a molar fraction of Al and/or In can be increased or decreased from metal layer-contact layer interface 20 toward contact layer-semiconductor structure interface 22. To this extent, FIGS. 2A and 2B show illustrative composition profiles 30, 32 for Al and In, respectively, according to an embodiment of the invention. As shown in FIG. 2A, a composition profile 30 for Al increases from the metal layer-contact layer interface toward the contact layer-semiconductor structure interface. Conversely, as shown in FIG. 2B, a composition profile 32 for In decreases from the metal layer-contact layer interface toward the contact layer-semiconductor structure interface.

It is understood that composition profiles 30, 32 are only illustrative. For example, Al could decrease from the metal layer-contact layer interface toward the contact layer-semiconductor structure interface and/or In could increase from the metal layer-contact layer interface toward the contact layer-semiconductor structure interface. Further, the molar fraction, and therefore the composition profile, for either Al or In could remain substantially constant throughout contact layer 14 (FIG. 1). In any event, the Al composition can remain greater than approximately one percent throughout contact layer 14, while a molar fraction of In can exceed approximately 0.001% throughout contact layer 14.

Figure 3:
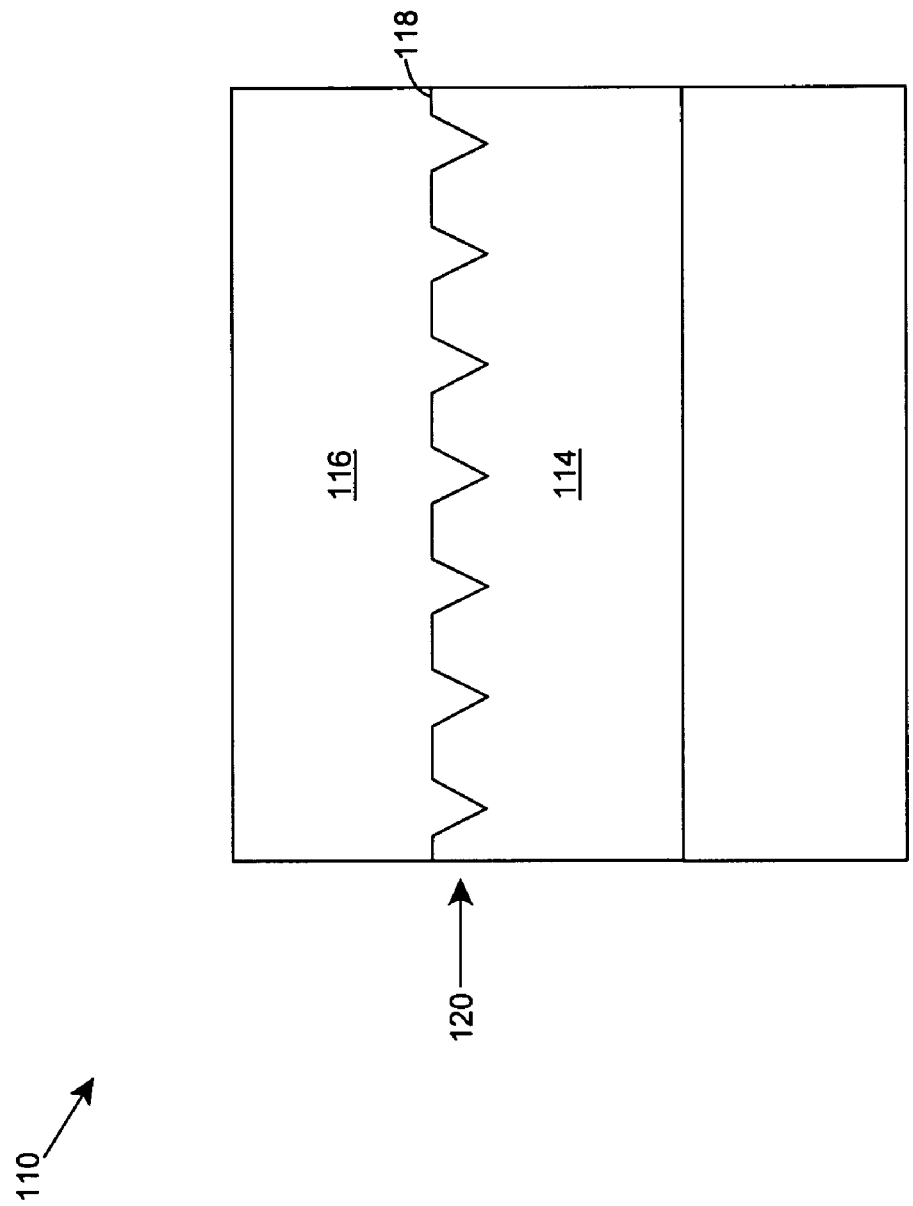
FIG. 3 shows an illustrative ohmic contact for a nitride-based semiconductor device according to an alternative embodiment of the invention.

Returning to FIG. 1, metal layer-contact layer interface 20 is shown as a substantially flat interface. To this extent, a surface 18 of contact layer 14 can be left as is after contact layer 14 is grown and/or altered in some manner. For example, ions can be implanted on surface 18 to change a surface Fermi level and/or improve conductivity of contact layer 14. Further, contact layer 14 can be mechanically and/or chemically polished to adjust the smoothness of metal layer-contact layer interface 20 for an improved adhesion of and/or reduced barrier between contact layer 14 and metal layer 16. However, it is understood that metal layer-contact layer interface 20 can comprise one or more alternative interfaces. For example, FIG. 3 shows an illustrative ohmic contact for a nitride-based semiconductor device 110 according to an alternative embodiment of the invention. In this case, a metal layer-contact layer interface 120 between metal layer 116 and contact layer 114 comprises a plurality of sharp pyramids protruding from metal layer 116 into contact layer 114, which improve the adhesion between contact layer 14 and metal layer 16. The sharp pyramids of metal layer-contact layer interface 120 can be formed by first etching, e.g., photo-chemically etching, a surface 118 of contact layer 114 and then depositing metal layer 116 on contact layer 114.

Figure 4:
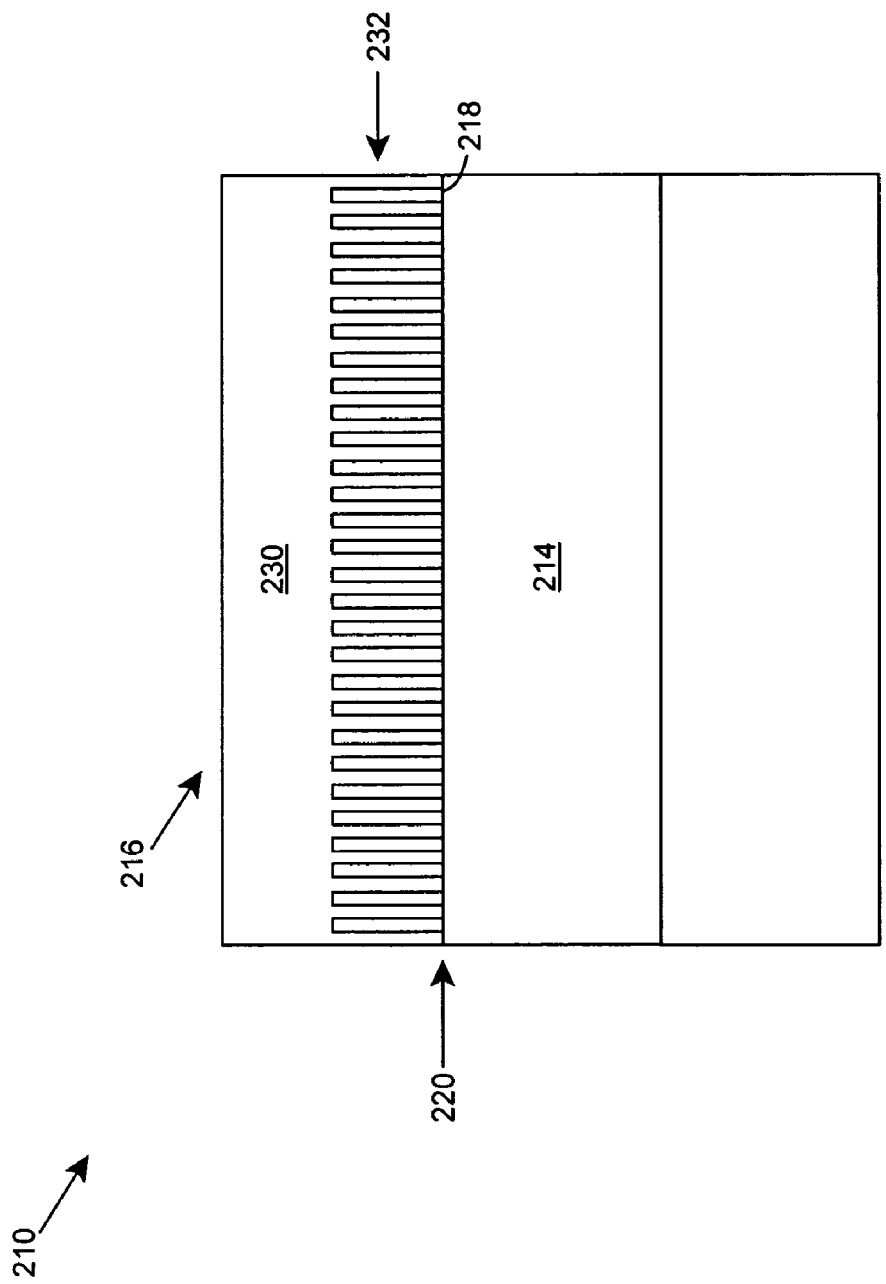
FIG. 4 shows an illustrative ohmic contact for a nitride-based semiconductor device according to another alternative embodiment of the invention.

Additionally, metal layer 116 can comprise one or more alternative configurations. For example, FIG. 4 shows an illustrative ohmic contact for a nitride-based semiconductor device 210 according to another alternative embodiment of the invention. In this case, metal layer 216 includes a plurality of needles 232, such as periodic needles, that each contact surface 218 of contact layer 214 to form a metal layer-contact layer interface 220. Metal layer 216 further includes an overlaying contact metal 230 that connects each of the plurality of needles 232. Needles 232 can be formed using a known solution, such as lithograph processing. By using needles 232, one or more functions of the ohmic contact can be modified/added. For example, needles 232 can function as a grating for light extraction and/or reflection.

Figure 5:
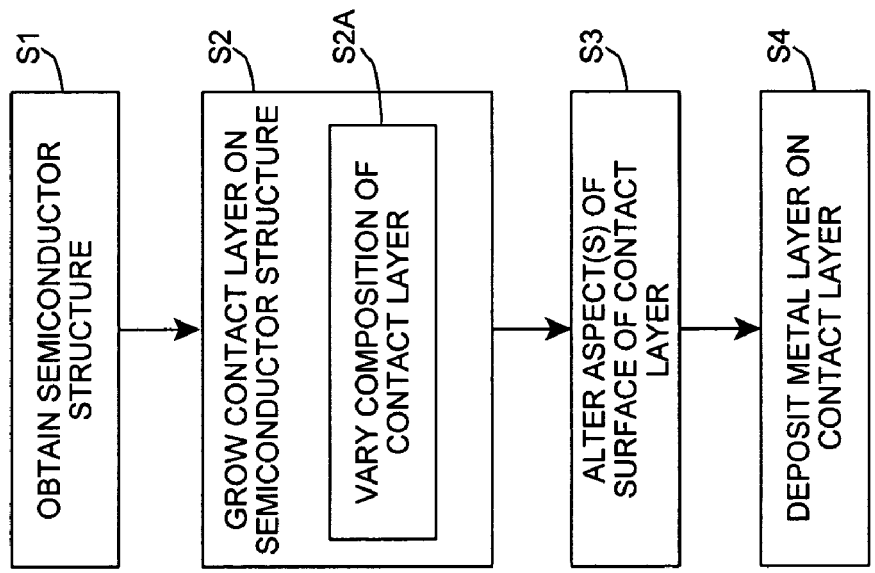
FIG. 5 shows illustrative process steps for manufacturing a semiconductor device according to an embodiment of the invention.

In one embodiment, the invention further provides a method of manufacturing a semiconductor device. To this extent, FIG. 5 shows illustrative process steps for manufacturing a semiconductor device according to an embodiment of the invention. Referring to FIGS. 1 and 5, in step S1, a nitride-based semiconductor structure 12 is obtained. This can include, for example, growing, depositing, altering, forming, and/or the like, one or more layers, structures, contacts, and/or the like, to form a semiconductor structure that is capable of operating in a desired manner as is known in the art. Further, a preformed and/or partially formed semiconductor structure can be provided.

In any event, in step S2, a contact layer 14 is grown on semiconductor structure 12 using any known solution. As noted herein, contact layer 14 includes at least Al and In, and can further include Ga and N. While growing contact layer 14, in step S2A, the composition of contact layer 14 can be varied. For example, a molar fraction of one of Al or In can be increased or decreased from metal layer-contact layer interface 20 toward a contact layer-semiconductor layer interface 22, while maintaining a substantially contact molar fraction of the other of Al or In throughout contact layer 14.

In step S3, one or more aspects of surface 18 of contact layer 14 can be altered using any known solution. For example, surface 18 can be etched, photo-chemically etched, mechanically polished, chemically polished, ions can be implemented, and/or the like. In step S4, metal layer 16 can be deposited on contact layer 14 using any known solution. For example, metal layer 16 can be deposited using thermal evaporation, e-beam evaporation, chemical deposition, electroplating, galvanic deposition, and/or the like. It is understood that the various process steps shown in FIG. 5 are only illustrative. To this extent, various modifications to the number and/or order of steps performed can be made as recognized by one in the art.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A nitride-based semiconductor device comprising:
   a nitride-based semiconductor structure, the semiconductor structure comprising an AlGaN semiconductor; and
   an ohmic contact to the AlGaN semiconductor, the ohmic contact including:
      a contact layer comprising at least Aluminum (Al) and Indium (In) directly on the semiconductor structure; and
      a metal layer directly on the contact layer.

2. The semiconductor device of claim 1, wherein the contact layer further comprises Gallium (Ga) and Nitrogen (N).

3. The semiconductor device of claim 1, wherein a molar fraction of at least one of Al or In in the contact layer increases or decreases from a metal layer-contact layer interface toward a contact layer-semiconductor structure interface.

4. The semiconductor device of claim 1, wherein a thickness of the contact layer is between approximately one nanometer and approximately five thousand nanometers.

5. The semiconductor device of claim 1, wherein an Al composition of the contact layer is greater than approximately one percent.

6. The semiconductor device of claim 1, wherein an In molar fraction of the contact layer exceeds approximately 0.001%.

7. The semiconductor device of claim 1, wherein a metal layer-contact layer interface comprises a plurality of sharp pyramids protruding from the metal layer into the contact layer.

8. The semiconductor device of claim 1, wherein the metal layer comprises:
   a plurality of needles contacting the contact layer; and
   an overlaying contact metal that connects each of the plurality of needles.

9. The semiconductor device of claim 1, wherein the semiconductor device is configured to operate as one of: a light emitting diode, a laser, a bipolar junction transistor, a heterojunction bipolar transistor, a thyristor, and a photodiode.

10. The semiconductor device of claim 1, wherein the semiconductor structure comprises a p-n junction.

11. The semiconductor device of claim 1, wherein the AlGaN semiconductor comprises a high molar fraction of Al.

12. The semiconductor device of claim 1, wherein the AlGaN semiconductor is a Mg-doped AlGaN semiconductor.

13. A nitride-based semiconductor device comprising:
   a nitride-based semiconductor structure, wherein the semiconductor structure comprises an AlGaN semiconductor; and
   an ohmic contact to the AlGaN semiconductor, the ohmic contact including:
      a contact layer comprising Aluminum (Al), Indium (In), Gallium (Ga), and Nitrogen (N) on the semiconductor structure; and
      a metal layer on the contact layer, wherein a molar fraction of one of Al or In in the contact layer increases or decreases from a metal layer-contact layer interface toward a contact layer-semiconductor structure interface, and wherein the metal layer-contact layer interface includes at least one of: a plurality of sharp protruding metal pyramids or a plurality of metal needles.

14. The semiconductor device of claim 13, wherein the other of Al or In has a substantially constant molar fraction throughout the contact layer.

15. The semiconductor device of claim 13, wherein the contact layer comprises a p-type semiconductor.

16. A nitride-based semiconductor device comprising:
   a nitride-based semiconductor structure; and
   an ohmic contact to an active layer in the semiconductor structure, the ohmic contact including:
      a contact layer comprising at least Aluminum (Al) and Indium (In) directly on the semiconductor structure; and
      a metal layer directly on the contact layer, wherein the metal layer protrudes into the contact layer, wherein the active layer comprises Mg-doped AlGaN.

17. The semiconductor device of claim 16, wherein a molar fraction of one of Al or In in the contact layer increases or decreases from a metal layer-contact layer interface toward a contact layer-semiconductor structure interface.

18. The semiconductor device of claim 16, wherein the contact layer further comprises Gallium (Ga) and Nitrogen (N).

* * * * *